United States Patent
Falconer

(10) Patent No.: US 6,204,683 B1
(45) Date of Patent: Mar. 20, 2001

(54) APPARATUS AND METHOD FOR REDUCING CROSSTALK IN AN INTEGRATED CIRCUIT WHICH INCLUDES A SIGNAL BUS

(75) Inventor: Maynard Falconer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/313,742

(22) Filed: May 18, 1999

(51) Int. Cl.$^7$ ................................................... H03K 17/16
(52) U.S. Cl. ............................ 326/30; 326/86; 327/108
(58) Field of Search .................................. 326/30, 83, 86, 326/90, 82; 375/244, 288; 327/108

(56) References Cited

U.S. PATENT DOCUMENTS

| | | | |
|---|---|---|---|
| 5,010,524 | 4/1991 | Fifield et al. | 365/205 |
| 5,311,074 | 5/1994 | Mori et al. | 307/443 |
| 5,475,643 | 12/1995 | Ohta | 365/206 |
| 5,530,377 | * 6/1996 | Walls | 326/30 |
| 5,596,506 | 1/1997 | Petschauer et al. | 364/491 |
| 5,659,198 | 8/1997 | Okutomo et al. | 257/659 |
| 5,731,711 | * 3/1998 | Gabara | 326/30 |
| 5,751,161 | * 5/1998 | Wei et al. | 326/30 |
| 5,864,584 | * 1/1999 | Cao et al. | 375/244 |
| 6,118,310 | * 9/2000 | Esch | 327/108 |

* cited by examiner

Primary Examiner—David Nelms
Assistant Examiner—David Lam
(74) Attorney, Agent, or Firm—Blakely, Sokoloff, Taylor & Zafman LLP

(57) ABSTRACT

An apparatus and method to compensate for variations in effective electrical impedance of a digital bus having plurality of transmission lines in a very large scale integrated circuit includes bus driver circuitry, which comprises a plurality of transistors coupled to an output node that is connected to a corresponding one of the transmission lines. Control circuitry is utilized to selectively enable/disable the transistors, thereby adjusting the driver impedance of the bus driver circuitry so as to match a state of the digital bus.

13 Claims, 6 Drawing Sheets

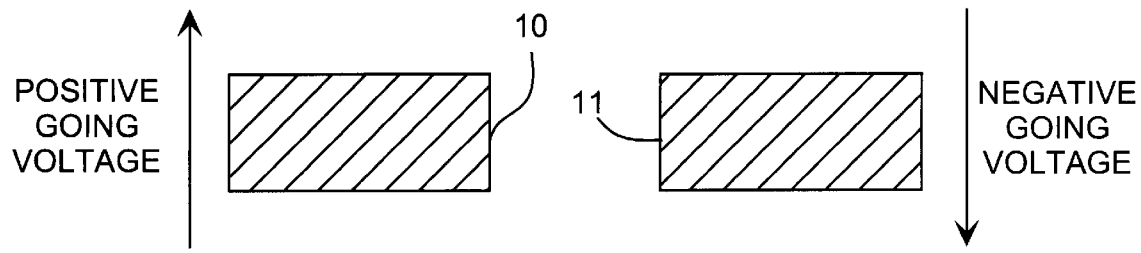
FIG. 1A
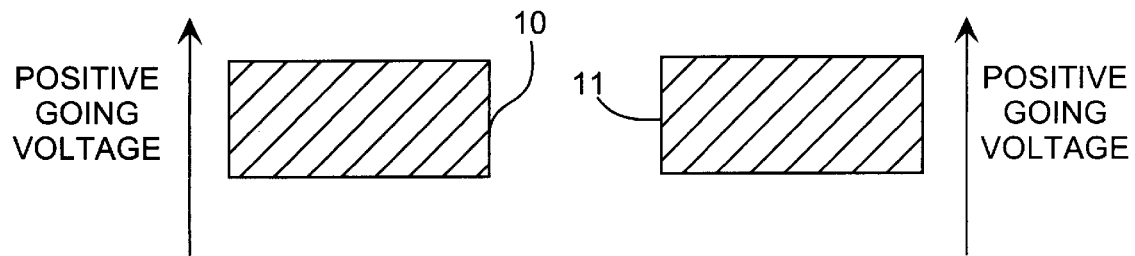
FIG. 1B
| EVEN STATES | ↑ ↑ , ↓ ↓ |
| SINGLE BIT STATES | 0 ↑ , ↓ 0 |
| ODD STATES | ↓ ↑ , ↑ ↓ |
| DON'T CARE STATE | 0 0 |
FIG. 2

APPARATUS AND METHOD FOR REDUCING CROSSTALK IN AN INTEGRATED CIRCUIT WHICH INCLUDES A SIGNAL BUS

FIELD OF THE INVENTION

This invention relates to the field of signal transmission lines implemented in a semiconductor device that includes an integrated circuit or chip. More specifically, the invention relates to the field of data signal loss due to the physical structures of signal lines and busses in integrated circuits.

BACKGROUND OF THE INVENTION

Integrated circuit technology has continually advanced to produce increased device performance largely by shrinking the dimensions of the physical structures fabricated on semiconductor chips. For example, the trend today is to produce devices in signal lines having physical dimensions in the sub-micron range.

As structures have been scaled down in size, factors such as noise and signal interference have become major problems. Basically, the close physical distance between adjacent bidirectional signal lines leads to unintentional coupling and interference. This problem is commonly referred to as crosstalk.

A variety of techniques have been used to reduce crosstalk between adjacent signal lines. In the field of random access memory arrays, shielded bit line architectures have been employed in which two pairs of opposed bit lines associated with a common sense amplifier have an adjacent unselected line pair that is clamped to AC ground to shield the selected line pair from dynamic coupling effects. This approach is described in U.S. Pat. No. 5,010,524. A similar approach is disclosed in U.S. Pat. No. 5,646,556, which teaches an apparatus for precharging pairs of bus conductors to alternating rails in order to minimize crosstalk and speed degradation problems. Another example of modifying the spacing and physical arrangement of the signal lines to prevent crosstalk is described in U.S. Pat. No. 5,475,643.

Other practitioners have approached the problem from a different perspective. For example, U.S. Pat. No. 5,596,506 teaches a method for predicting respective magnitudes of crosstalk voltages before the actual fabrication of an integrated circuit (I/C) chip. Following circuit simulation, the signal line layout of the chip is modified according to an algorithm, which includes changing driver circuits, moving signal lines, and inserting buffer circuits into the chip. U.S. Pat. No. 5,311,074 attempts a more radical approach to reducing crosstalk by reducing signal line voltages through a large scale cell array region of the chip. The signal voltages are restored back to their original logic levels upon exiting the cell array.

Because digital busses typically consist of numerous transmission lines routed in close proximity to each other—with the individual signal lines providing bi-directional transmission capabilities—one of the effects of coupling is an electrical change in the impedance of the transmission line due to the state of neighboring transmission lines. By way of example, coupled transmission lines have various orthogonal impedance modes that can be used in superposition to describe any set of bus states. For a N conductor coupled bus, there are N different modes. Each of these N modes has an associated impedance that is commonly referred to as the modal impedance.

Any given state of the digital bus causes a member transmission line to have an effective electrical impedance that is a combination of the modal impedances. This effective electrical impedance is always greater than or equal to the lowest modal impedance. Similarly, the effective electrical impedance is always less than or equal to the largest modal impedance. In the context of the present application, the effective electrical impedance of a transmission line is referred to as the crosstalk induced impedance. Thus, crosstalk induced impedances are state dependent impedances.

In a high performance, bidirectional digital bus implemented with CMOS circuit technology, it is important to match the driver impedance to the transmission line impedance in order to obtain good signal quality, and also to reduce inter-symbol interference (ISI). Inter-symbol interference refers to the timing and signal quality impact of the previous state of the transmission line on the current state. In CMOS and other types of bidirectional busses, ISI is a function of the mismatch between the driver impedance, the transmission line impedance, and the transmission line length. Most often, it is impractical to reduce the transmission line length. Therefore it is crucial to match the driver impedance to the line impedance as closely as possible to reduce ISI and to obtain acceptable signal quality. However, an unfulfilled need exists for an apparatus and method capable of compensating for the differences in crosstalk induced impedances for coupled busses.

SUMMARY OF THE INVENTION

The present invention is useful in reducing the maximum current demand of bus drivers in an integrated circuit and may be advantageously employed to achieve a higher routing density of bus lines while still maintaining acceptable signal quality and ISI. The invention provides a way to compensate for variations in crosstalk induced impedances in integrated circuits implementing coupled signal busses.

In one embodiment, the invention provides an apparatus for driving a digital bus having a plurality of transmission lines. The apparatus includes a plurality of transistors coupled to an output node, which is connected to a transmission line of the digital bus. Control circuitry selectively enables/disables each of the transistors to create a transistor combination to produce an impedance at the output node that matches the effective electrical impedance of the digital bus.

BRIEF DESCRIPTION OF THE DRAWINGS

The present invention is illustrated by way of example, and not limitation, in the figures of the accompanying drawings, where:

FIG. 1A is a cross-sectional view of two coupled striplines in an odd impedance mode.

FIG. 1B is a cross-sectional view of two coupled striplines in an even impedance mode.

FIG. 2 is a table showing various impedance states for two coupled transmission lines.

DETAILED DESCRIPTION

Figure 3:
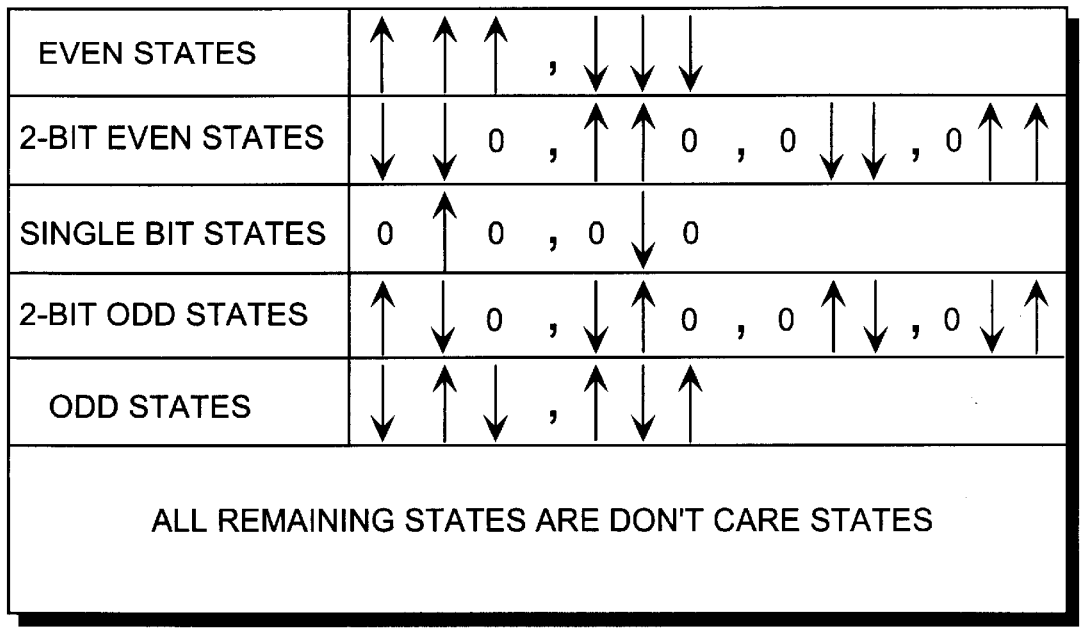
FIG. 3 is a table showing various impedance states for three coupled transmission lines.

Throughout the following description specific details are set forth in order to provide a more thorough understanding of the invention. However, the invention may be practiced without these particulars. In other instances, well known elements have not been shown or described in detail to avoid unnecessarily obscuring the present invention.

To understand how a given state of a bus can cause a member transition line to have an effective electrical impedance that varies depending upon the state of the bus, consider the examples of FIGS. 1A and 1B. FIGS. 1A and 1B both show a cross-sectional view of two coupled transmission lines. These coupled transmission lines comprise stripline conductors that may be fabricated in accordance with well known semiconductor metallization processing techniques.

FIG. 1A illustrates the bus in an odd mode of operation, wherein conductor 10 experiences a positive going voltage transition while, at the same time, conductor 11 experiences a negative going voltage transition. FIG. 1B shows the opposite condition; that is, the two conductor lines in an even impedance mode with conductor 10 and 11 both experiencing positive going voltage transitions. Each of the two modes illustrated in FIGS. 1A and 1B has an associated modal impedance, which may be referred to as $Z_{ODD}$ and $Z_{EVEN}$. It should be appreciated, however, that there are more than just two impedance states for the transmission lines shown in FIGS. 1A and 1B.

FIG. 2 is a table that lists the seven different impedance states of the two coupled transmission lines discussed above. The seven states include two even states, in which both conductors experience a positive-going voltage transition; two single states in which one conductor is stable (no transition), with the other conductor experiencing either a positive-going or negative-going voltage transition; two odd impedance states with both conductors experiencing opposite-going voltage transitions (either a positive-going voltage on one conductor and a negative-going voltage on the other, or vice-versa); and a "don't care" state in which both transmission lines are quiet. As summarized in the table of FIG. 2, these seven states result in three different cross-talk-induced impedances and one don't care state (quiet).

Importantly, since a similar bus driver device is driving both transmission lines, each of the two bus drivers can access what its neighboring driver is doing. In other words, by monitoring the neighboring bus drivers, each driver has access as to the current state of the neighboring driver device as well as what state will occur next on the digital bus. In accordance with the present invention, by accessing the state information of the bus, individual bus drivers can adjust their output impedance to match the cross-talk induced impedance associated with that particular bus state. This adjustment can be achieved in many different ways.

For example, ordinary impedance controllers may be used to internally generate different output impedances for the bus driver, which are either analog or digital in nature. Alternatively, externally generated impedance controllers may also be utilized to adjust the output impedance of the driver to match the effective electrical impedance associated with a particular state of the bus.

FIG. 3 is a table that illustrates different states of a bus having three coupled transmission lines. As can be seen, in this example, three coupled transmission lines lead to five different impedance states for the digital bus as shown in FIG. 3. The different states include an even state, a two-bit even state, single bit states, two-bit odd states, odd states, and don't care states. Practitioners in the art will understand that if one is concerned about terminating the backwards coupled cross-talk, then the don't care states can be further divided to include two more impedance states. These additional impedance states could be added to ensure that the bus driver performs as a match termination to the cross-talk induced impedance for the transmission line.

For tightly packed, or highly coupled transmission lines, the technique of the present invention can also be applied to incorporate five coupled lines. (It should be further noted that in the tables of FIGS. 2 and 3, an upwardly pointing arrow represents a rising edge of a voltage transition on a transmission line, whereas the downward pointing arrow represents the falling edge. A 0, of course, represents no change on the transmission line; that is, the line stays either high or low and no transmission occurs.

Figure 4:
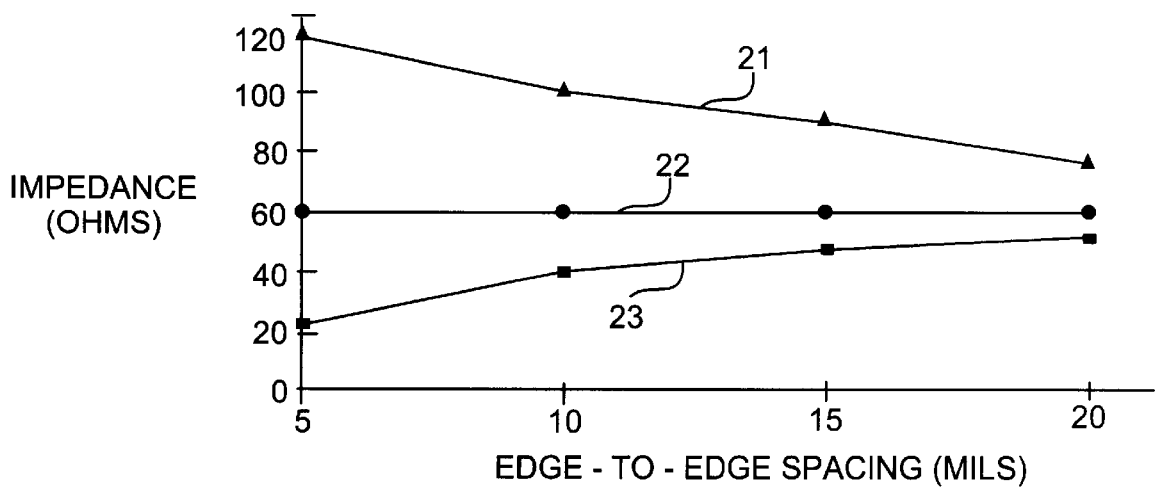
FIG. 4 is a graph that illustrates impedance variation for a three conductor stripline.

To better appreciate the advantages offered by the present invention, FIG. 4 shows the magnitude of the cross-talk induced impedances on the bus as a function of the transmission line edge-to-edge spacing. In the graph of FIG. 4, the even impedance states are illustrated by line 21, the single bit impedance states for a three conductor stripline are shown by line 22, and the odd impedance states are represented by line 23. In the particular example shown, each of the three conductor striplines has a width of approximately 5 mils. As one would expect, for highly coupled transmission lines the magnitude of the cross-talked induced impedance decreases as a function of separation. This is to say, the more tightly stacked the striplines are the greater the variation of the effective electrical impedance of the bus.

Figure 5:
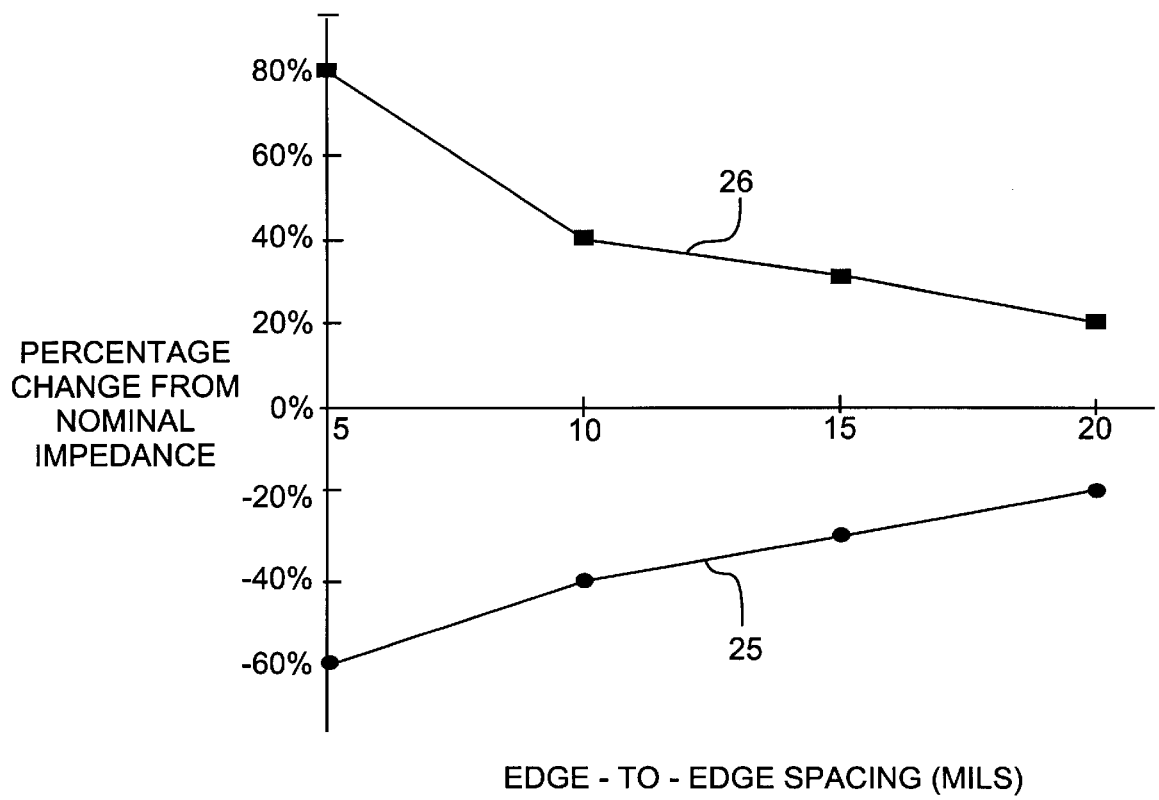
FIG. 5 is a plot showing percentage change in crosstalk induced impedance as a function of separation for three coupled transmission lines.

FIG. 5 is a plot of the cross-talk induced impedance as a function of separation as plotted by percentage change from nominal impedance. Line 26 in FIG. 5 represents the odd impedance state of a three coupled transmission lines, with line 25 representing the even state impedance for the same three coupled transmission lines. Thus, FIG. 5 represents the impedance envelope of the digital bus as a function of spacing. Once again, in terms of percentage variation from nominal impedance, the greatest percentage change that the bus experiences occurs when the lines are closely spaced together. It is in these situations, where the bus lines are highly coupled, that the present invention achieves the greatest benefit.

To put it another way, in high performance digital busses which are closely coupled, a mismatch between the driver impedance and the transmission line impedance results in high levels of intersymbol interference as well as degradation of timing and signal quality on the transmission line. By dynamically matching the driver impedance to the line impedance as the state of the bus changes, the present invention advantageously reduces ISI and obtains good signal quality in an integrated circuit having many transmission lines that are routed in close proximity to each other.

Another important benefit of dynamically matching bus driver impedance to the modal impedance of the transmission lines is that maximum current demand can be greatly reduced. Consider, for example, a two-volt, 65-line digital bus having drivers that are all 65 ohms. Even mode switching of this bus demands a peak voltage of (2 volts * 65 lines)/65 ohms=2 amperes. For the same bus, odd mode switching demands 1 ampere from the high supply and 1 ampere from the low supply. Therefore, the maximum current demand on either power supply comes from the even mode switching current of two amperes. In this example, the cross-talk-induced impedance matching bus driver circuit utilizes a higher impedance for even mode switching and a lower impedance value for odd mode switching, when only half the drivers are demanding current from each supply.

Figure 6:
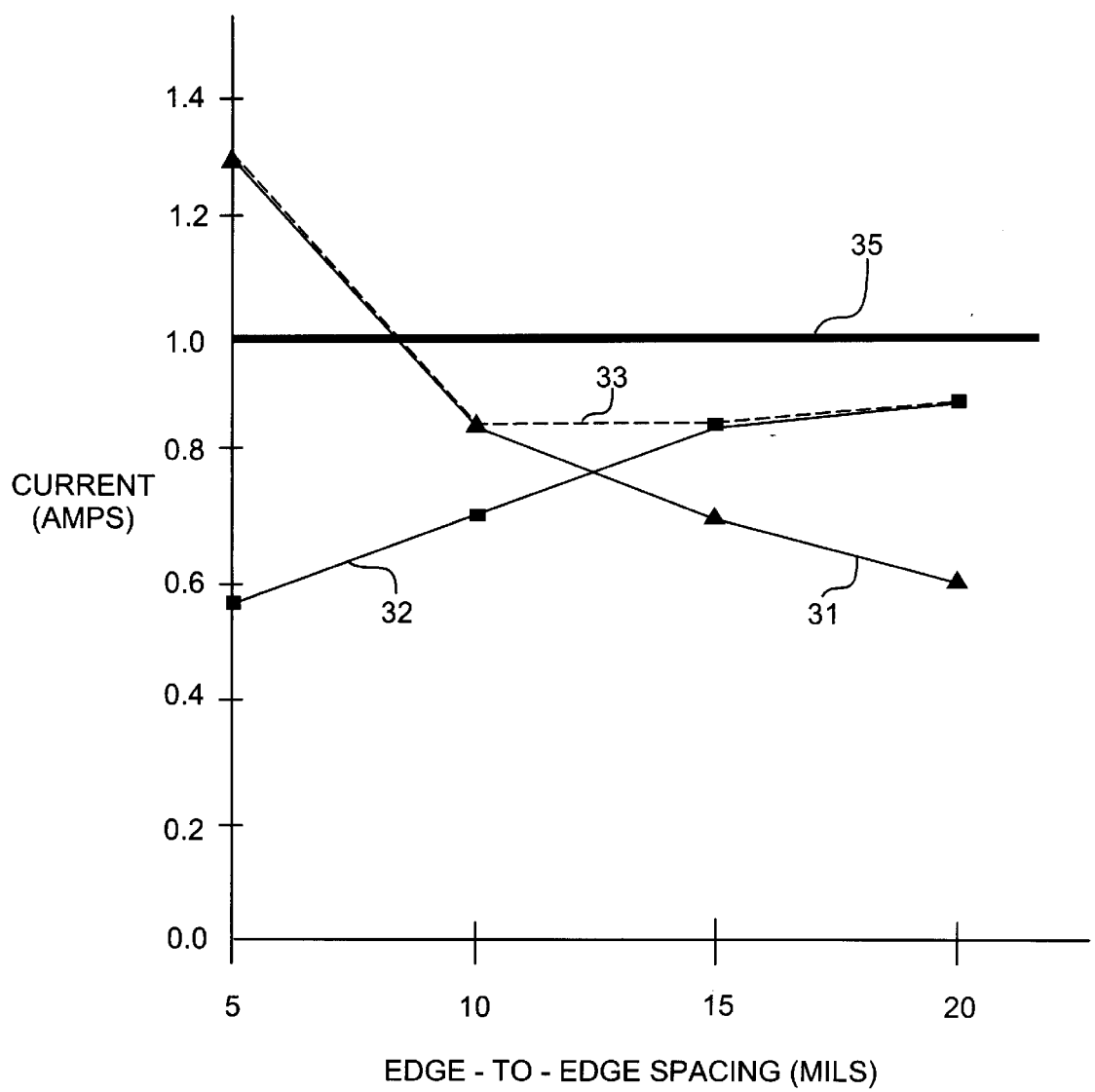
FIG. 6 is a plot of normalized maximum current demand for an impedance matching driver circuit in accordance with one embodiment of the present invention.

FIG. 6 illustrates normalized maximum current demand for an impedance matching driver in accordance with the present invention. As shown in the plot of FIG. 6, line 35 represents a standard prior art 65 ohm bus driver providing normalized maximum current demand of 1 ampere. Line 31 represents current demand for odd impedance states as a function of edge-to-edge spacing, and line 32 represents the maximum current demand for even mode switching. Dashed line 33 represents the maximum current demand in accordance with the present invention for either odd or even mode switching.

As FIG. 6 shows, for a 65 ohm stripline, the maximum current demand is significantly lower for a cross-talk induced impedance matching driver than for a standard bus driver for most cases. It is not until the edge-to-edge spacing of the conductors becomes smaller than approximately 7.5 mils (or the spacing approaches infinite spacing) that the impedance matching driver matches the standard driver maximum current demand.

Figure 7:
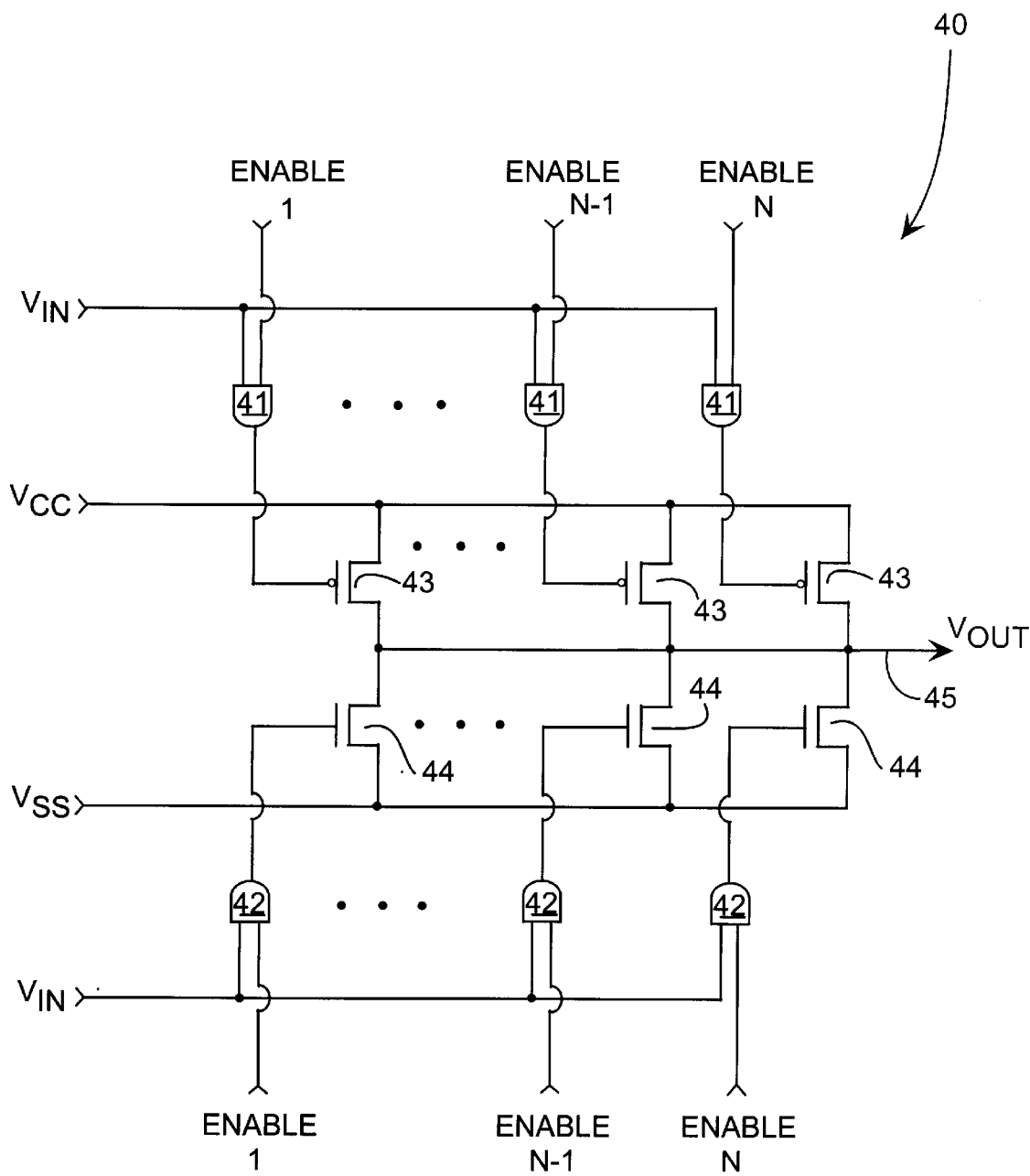
FIG. 7 is one possible implementation of a bus driver circuit in accordance with the present invention.
Figure 8:
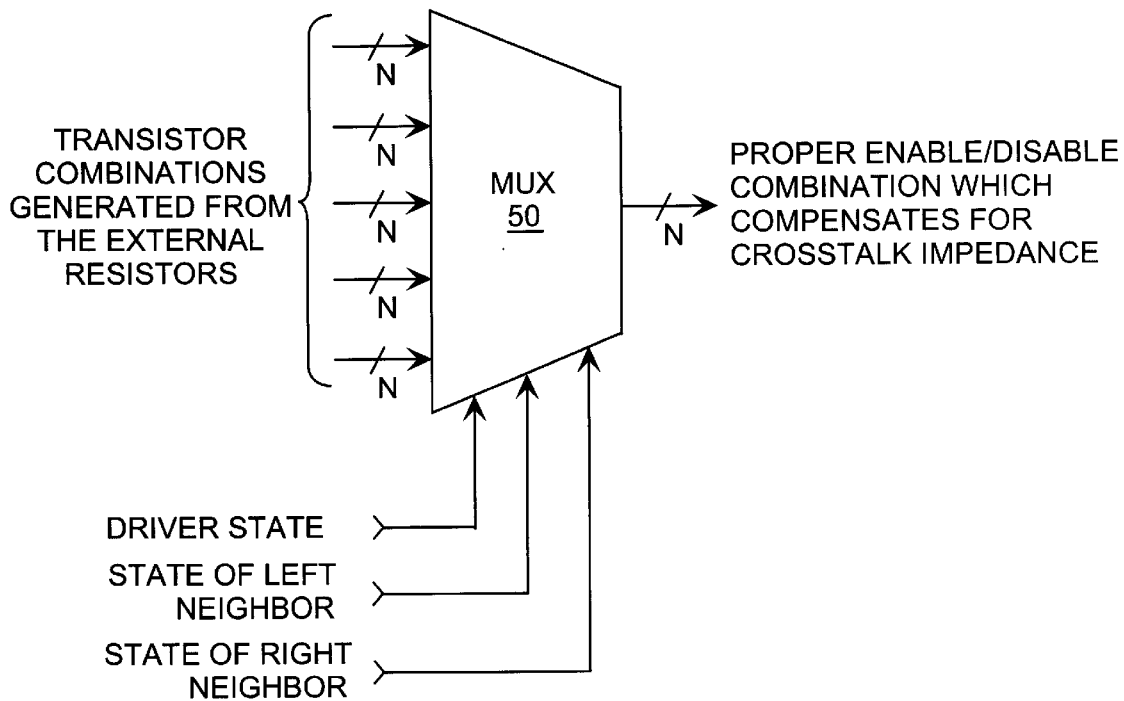
FIG. 8 illustrates the use of a multiplexer to select proper transistor combinations for the bus driver circuit shown in FIG. 7.

Referring now to FIGS. 7 and 8 there is shown one possible implementation of the cross-talk-induced impedance matching bus driver circuitry of the present invention. FIG. 7 is a circuit schematic diagram of a bus driver circuit 40 comprising a plurality of transistors coupled in parallel, each of which is enabled or disabled when the bus is being driven. P-type field-effect devices 43 are shown coupled in series with N-type field-effect devices 44 between power supply lines $V_{cc}$ and $V_{ss}$. $V_{cc}$ represents the positive power supply and $V_{ss}$ represents the negative power supply, or ground. The intermediate node 45 between P-type transistors 43 and N-type transistors 44 represents the output node ($V_{OUT}$) of bus driver circuit 40.

Driver impedance at output node 45 is varied by selectively enabling and disabling different combinations of paralleled transistors 43 and 44. This is achieved in circuit 40 for the use of AND gates 41 and 42. As shown, each of AND gates 41 have two inputs, one of which is coupled to an input voltage $V_{IN}\#$ (where $V_{IN}\#$ is to compliment $V_{IN}$). The other input of AND gate 41 is coupled to a separate enable line. The outputs of each of AND gates 41 is coupled to the gate of one of the transistors 43. Thus, the input voltage $V_{IN}\#$ and the individual enable lines are used to turn on each of transistors 43 thereby changing the conductance of each of the transistors coupled to output node 45.

Similarly, AND gates 42 each have an output which is coupled to the gate of corresponding one of transistors 44. Each of the AND gates 42 has one input coupled to reference voltage VIN and a second input coupled to an enable line for selectively turning on and off individual ones of transistors 44. Note that the bus driver circuit 40 of FIG. 7 represents a generalized case in which up to N (where N is an integer) transistors may be selectively enabled/disabled to vary the impedance in output node 45.

External precision resistors, representing desired impedances can also be referenced to create the transistor combination that generates the desired driver impedance to match the state of the bus. A great variety of impedance controlled circuits already exist—both the digital and analog variety—which can be used in accordance with the present invention to generate a transistor combination to match the cross-talk induced impedance of a particular transmission line. Therefore, practitioners of ordinary skill in the art will appreciate that combination-generating circuitry can be replicated for each of the impedance states that a bus designer wishes to match. A multiplexer 50, as shown in FIG. 8, may then be used to select the proper impedance based on the state of the bus driver and its neighboring bus drivers.

Observe that in FIG. 8, the inputs to multiplexer 50 represent various transistor combinations, which may be generated from external resistors as discussed above. The proper combination for matching the cross-talk-induced impedance is obtained from the bus driver state, as well as the state of its neighboring bus driver circuits. This combination may, for example, be output for multiplexer 50 to the driver implementation shown in FIG. 7 to enable/disable the transistors 43 and 44 coupled to output node 45.

It is crucial to note that the present invention does not require the use of external resistors, or of a digital bus driver having enable and disable lines. Various implementations are well within the skill of an ordinary practitioner in the art. In other words, the driver may be analog controlled, or used a different scheme of digital control. Likewise, the output impedance of the bus driver circuit may be determined internally, or externally. In addition, some of the driver impedances may be derived from the impedances of other bus states. The key point of the present invention is to match the bus driver impedance to the cross-talk-induced impedance of the transmission line. This is achieved by accessing the states of the neighboring bus driver circuits, and then adjusting the output impedance of the driver circuit accordingly. This concept is independent of any specific implementation.

After having read the foregoing description, practitioners in the art will appreciate that the present invention provides optimum results for transmission lines that are routed in parallel along their entire length. Entire length routing typically occurs in conventional busses such as the RAM bus, AGP bus, and numerous source synchronous buses. Of course, entire length parallelism may be intentionally implemented along with a cross-talk-induced impedance compensating bus driver in accordance with the present invention to achieve a higher router density in bus lines and still maintain good signal quality and reduced ISI. It is also worth noting that cross-talk-induced impedance compensating bus drivers of the type described in the present application are backwards compatible with standard drivers. This compatibility is achieved by simply setting all of the impedance values for each state to a nominal value. Thus, the present invention finds wide applicability in integrated circuits, such as microprocessors, which rely upon densely routed bus lines.

It should be understood that although the present invention has been described in conjunction with specific embodiments, numerous modifications and alterations could be made without departing from the scope of the present invention. Accordingly, the specification and drawings are to be regarded in an illustrative rather than a restrictive sense.

I claim:

1. A method for driving a digital bus that includes a plurality of closely coupled lines, the method comprising the steps of:

(a) accessing a particular impedance state of the digital bus; and (b) adjusting an output impedance of a bus driver circuit to match cross-talk induced impedance associated with the particular impedance state of the digital bus, the bus driver circuit being coupled to a respective line of the digital bus.

2. The method according to claim 1 wherein the particular impedance state is associated with an effective electrical impedance of the digital bus.

3. The method according to claim 1 wherein the bus driver circuit comprises a plurality of transistors coupled in parallel to an output that is connected to the respective line of the digital bus, and further step (b) comprises the step of:

selectively enabling the transistors to create a combination of transistors which generates the output impedance of the bus driver circuit.

4. The method according to claim 1 wherein the adjusting step is performed dynamically.

5. An integrated circuit for reduced cross-talk, comprising:

a digital bus having a plurality of coupled transmission lines, a transmission line having an effective electrical impedance that depends on a particular bus state;

a bus driver comprising a plurality of transistors coupled to an output node which is connected to the transmission line of the digital bus;

control circuitry that selectively enables/disables each of the transistors to create a transistor combination that produces an impedance at the output node that matches the effective electrical impedance associated with the particular bus state.

6. The integrated circuit of claim 5 wherein the control circuit includes a multiplexer that selects the transistor combination based on the effective electrical impedance.

7. The integrated circuit of claim 5 wherein the plurality of transistors comprise field-effect devices coupled in parallel to the output node, each field-effect device having a gate input that is coupled to the control circuitry.

8. The integrated circuit of claim 5 wherein the multiplexer comprises a plurality of inputs coupled to resistors that generate a plurality of transistor combinations.

9. The integrated circuit of claim 5 wherein the control circuitry comprises a digital logic circuit.

10. The integrated circuit of claim 5 wherein the effective electrical impedance is a collective function of a voltage condition associated with each transmission line of the digital bus.

11. Apparatus for driving a digital bus having a plurality of transmission lines comprising:

a plurality of bus driver circuits, each of which has an output coupled to a corresponding one of the transmission lines;

multiplexer circuitry to access a particular state of the digital bus; and a plurality of resistors coupled to the bus driver circuits to dynamically adjust a driver impedance of each of the bus driver circuits so as to match the cross-talk induced impedance associated with the particular state of the digital bus.

12. The apparatus of claim 11 wherein the resistors comprise external precision resistors.

13. The apparatus of claim 11 wherein the bus driver circuits each comprise a plurality of transistors coupled in parallel to the output, each transistor having an input that is selectively enabled to collectively create a transistor combination that generates the driver impedance.

* * * * *